United States Patent
Lee et al.

(10) Patent No.: US 10,847,650 B2
(45) Date of Patent: Nov. 24, 2020

(54) SEMICONDUCTOR STRUCTURE AND ASSOCIATED FABRICATING METHOD

(71) Applicant: TAIWAN SEMICONDUCTOR MANUFACTURING COMPANY LTD., Hsinchu (TW)

(72) Inventors: Jia-Rui Lee, Kaohsiung (TW); Kuo-Ming Wu, Hsinchu (TW); Yi-Chun Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/661,675

(22) Filed: Oct. 23, 2019

(65) Prior Publication Data
US 2020/0058789 A1    Feb. 20, 2020

Related U.S. Application Data

(62) Division of application No. 15/719,500, filed on Sep. 28, 2017, now Pat. No. 10,505,038.

(51) Int. Cl.
| | |
|---|---|
| *H01L 29/78* | (2006.01) |
| *H01L 29/423* | (2006.01) |
| *H01L 21/76* | (2006.01) |
| *H01L 21/762* | (2006.01) |
| *H01L 29/06* | (2006.01) |
| *H01L 29/66* | (2006.01) |

(52) U.S. Cl.
CPC ......... *H01L 29/7825* (2013.01); *H01L 21/76* (2013.01); *H01L 21/762* (2013.01); *H01L 29/0653* (2013.01); *H01L 29/42368* (2013.01); *H01L 29/42376* (2013.01); *H01L 29/66704* (2013.01); *H01L 29/7835* (2013.01)

(58) Field of Classification Search
CPC .......... H01L 29/7825; H01L 29/42368; H01L 29/66704; H01L 29/42376; H01L 29/7816; H01L 29/401; H01L 29/66674; H01L 21/76; H01L 21/762; H01L 21/76232
See application file for complete search history.

(56) References Cited

U.S. PATENT DOCUMENTS

| | | | |
|---|---|---|---|
| 5,741,740 A * | 4/1998 | Jang ................. | H01L 21/76224 438/435 |
| 2009/0140343 A1* | 6/2009 | Feilchenfeld ......... | H01L 29/407 257/367 |

(Continued)

OTHER PUBLICATIONS

Office action from Taiwan counterpart 107101236 dated Dec. 13, 2019.

*Primary Examiner* — Galina G Yushina
(74) *Attorney, Agent, or Firm* — WPAT, P.C., Intellectual Property Attorneys; Anthony King (57) ABSTRACT

A semiconductor structure is disclosed. The semiconductor structure includes: a substrate; an isolation region adjacent to the drain region; a gate electrode over the substrate and further downwardly extends into the substrate, wherein a portion of the gate electrode below a top surface of the substrate abuts the isolation region; and a source region and a drain region formed in the substrate on either side of the gate structure. An associated method for fabricating the semiconductor structure is also disclosed.

20 Claims, 12 Drawing Sheets

(56) References Cited

U.S. PATENT DOCUMENTS

| | | | |
|---|---|---|---|
| 2009/0256212 A1* | 10/2009 | Denison | H01L 29/0653 257/408 |
| 2013/0032912 A1* | 2/2013 | Chen | H01L 27/14643 257/431 |
| 2014/0113423 A1* | 4/2014 | Shrivastava | H01L 29/407 438/286 |
| 2016/0111488 A1* | 4/2016 | Lu | H01L 29/7825 257/330 |
| 2019/0035929 A1* | 1/2019 | Syue | H01L 29/41775 |

* cited by examiner

SEMICONDUCTOR STRUCTURE AND ASSOCIATED FABRICATING METHOD

CROSS REFERENCE TO RELATED APPLICATIONS

This application is a division of application Ser. No. 15/719,500, filed on Sep. 28, 2017, which is incorporated by reference in its entirety.

BACKGROUND

High voltage metal-oxide-semiconductor (MOS) transistors, such as laterally diffused metal oxide semiconductor (LDMOS) transistors, are widely used in applications like automobile industry, display drivers, portable telecommunication devices and medical equipment. The LDMOS transistors are often utilized for high-voltage applications. It is desirable that LDMOS transistors possess a higher breakdown voltage and a lower on-resistance (RON).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure relates to a laterally diffused metal oxide semiconductor (LDMOS) transistor and a method for manufacturing the same. The variations of the LDMOS transistor in accordance with embodiments are discussed. The various stages of fabricating the LDMOS transistor are illustrated. Throughout the various views and illustrative embodiments, like reference numbers are used to designate like elements.

Figure 1:
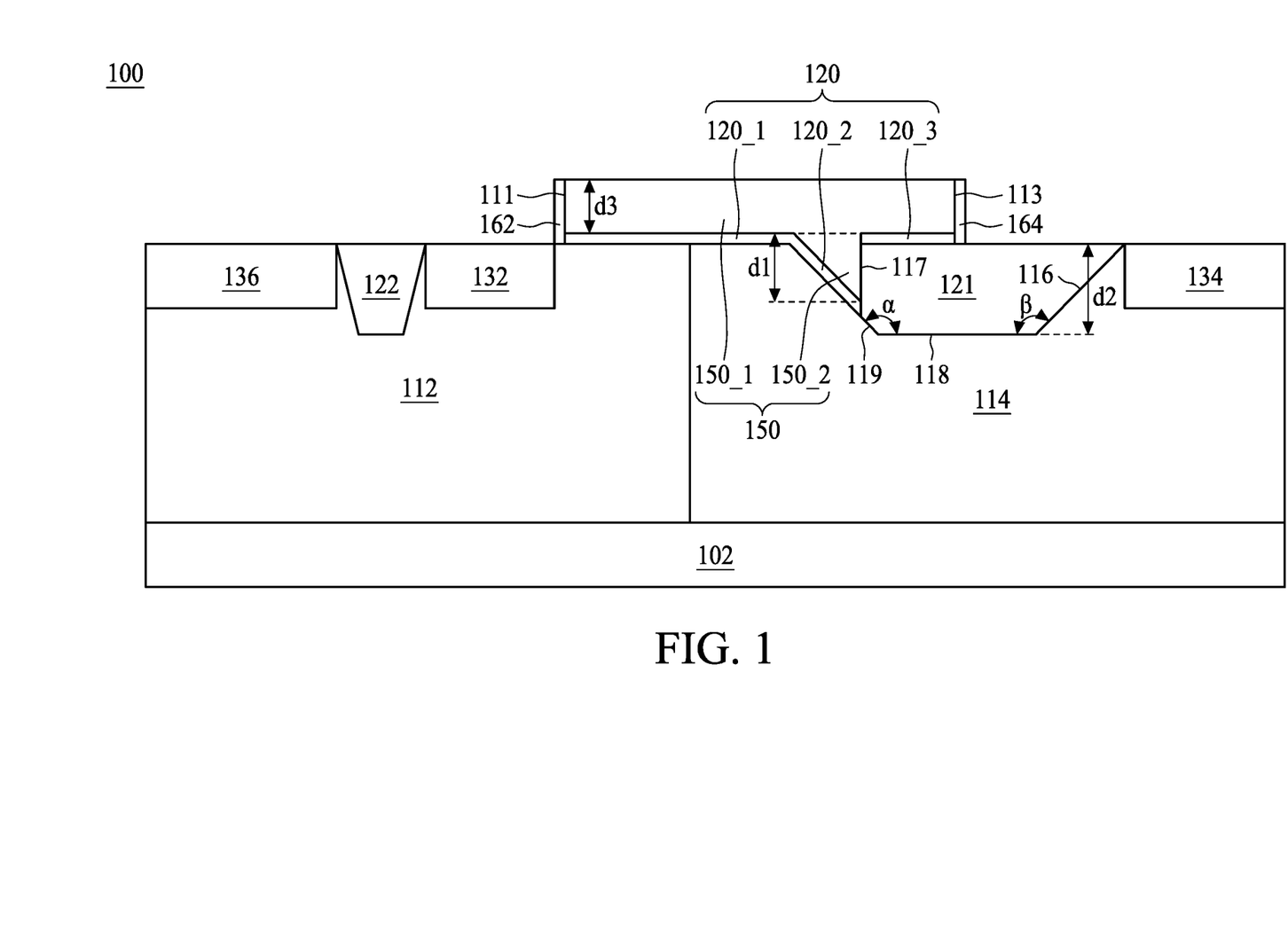
FIG. 1 is a cross-sectional view of a MOS transistor according to a first embodiment of the present disclosure.

FIG. 1 is a cross-sectional view of a MOS transistor 100 according to a first embodiment of the present disclosure. The MOS transistor 100 includes a semiconductor substrate 102, a first well region 114 of a first conductivity type, a second well region 112 of a second conductivity type opposite to the first conductivity type, isolation regions 121 and 122, a source region 132, a drain region 134, a pickup region 136, a gate dielectric layer 120, a gate electrode 150 and spacers 162, 164. In order to increase device breakdown voltage and to reduce on-resistance (RON), the gate electrode 150 is downwardly extending into the first well region 114 and laterally adjacent to the isolation region 121.

The semiconductor substrate 102 may be made of semiconductor material such as silicon, germanium, silicon germanium, silicon carbide and those consisting essentially of III-V compound semiconductors (e.g., GaAs and Si/Ge). The semiconductor substrate 102 may be amorphous, polycrystalline or single-crystalline. The semiconductor substrate 102 may be of N-type or P-type. In one embodiment, the MOS transistor 20 is a P-type MOS transistor and fabricated in a P-type semiconductor substrate 210, and the first conductive type is P-type and the second conductive type is N-type.

The source region 132 of the first conductivity type and the drain region 134 of the first conductivity type are disposed in the semiconductor substrate 210. In the embodiment that the MOS transistor 100 is a P-type MOS transistor, the source region 132 and the drain region 134 are doped with P-type dopants, such as boron, gallium, aluminum, indium, or a combination thereof with a doping concentration from about $10^{13}$ cm$^{-3}$ to about $10^{15}$ cm$^{-3}$.

The first well region 114 of the first conductivity type is acted as an extension region of the drain region 134, which is disposed laterally adjacent to the second well region 112 and surrounds the isolation region 121 and the drain region 134. In the embodiment that the MOS transistor 20 is a P-type MOS transistor, the first well region 114 is doped with P-type dopants such as boron, gallium, aluminum, indium, or a combination thereof with a doping concentration less than that of the drain region 134; that is, the first well region 114 may be or an P-well (PW) region or a high voltage P-well (HVPW) region.

The second well region 112 of the second conductivity type is located in the semiconductor substrate 102 at the source region 132 side and surrounds the isolation region 122, the source region 132 and the pickup region 136. In the embodiment that the MOS transistor 100 is a P-type MOS transistor, the second well region 112 is doped with N-type dopants; in other words, the second well region 112 is considered as an N-type well (NW) region or a high voltage N-well (HVNW) region.

The gate dielectric layer 120 is disposed over the semiconductor substrate 102 and includes a first gate dielectric layer portion 120_1, a second gate dielectric layer portion 120_2 and a third gate dielectric layer portion 102_3. In particular, the first gate dielectric layer portion 120_1 is disposed on a top surface of the second well region 112 and adjacent to the source region 132, and the first gate dielectric layer portion 120_1 extends to a top surface of the first well region 114 and contacts the second gate dielectric layer portion 120_2. The second gate dielectric layer portion 120_2 is disposed on a sidewall 119 recessed into the first well region 114 and contacts the isolation region 121. The third gate dielectric layer portion 120_3 is disposed on a top surface of the isolation region 121 and adjacent to the drain region 134. An angle α formed by the intersection of the sidewall 119 and a bottom surface 118 of the isolation region 121 may be greater than about 90 degrees and less than about 180 degrees. A thickness of the gate dielectric layer 120 is about 80 to about 250 angstroms. However, this is not a limitation of the present disclosure.

The isolation region 121 is located in the semiconductor substrate 102 and adjacent to the drain region 134. The isolation region 121 may include an oxide or nitride material. The isolation region 121 is utilized to reduce device electric field near the drain region 134. In one embodiment, the isolation region 121 is a shallow-trench isolation (STI) region. In another embodiment, the isolation region 121 is a field oxide (FOX) region. As can be seen from FIG. 1, the isolation region 121 is not bilateral symmetrical. A top surface of the isolation region 121 is substantially coplanar with the top surface of the first well region 114. A sidewall 116 of the isolation region 121 intersects with the bottom surface 118 thereof and forms an angle β. In some embodiments, the angle β may substantially equal to the angle α. Another sidewall 117 of the isolation region 121 may be substantially perpendicular to the top surface thereof, and a portion of the sidewall 119 is located between the sidewall 117 and the bottom surface 118 of the isolation region 121. The sidewall 117 extends from the top surface of the isolation region 121 into the isolation region 121 for a depth d1. A distance d2 between the top surface of the isolation region 121 and the bottom surface 118 is greater than the distance d1. In some embodiments, a ratio of d1 to d2 is in a range from about 0.4 to about 0.85. However, this is not a limitation of the present disclosure.

The gate electrode 150 is disposed over the gate dielectric layer 120. Specifically, the gate electrode 150 includes a first gate electrode portion 150_1 and a second gate electrode portion 150_2. The first gate electrode portion 150_1 extends from the first gate dielectric layer portion 120_1 close to the source region 132 to the third gate dielectric layer portion 120_3. The second gate electrode portion 150_2 downwardly extends into the first well region 114 and fills a region between the isolation region 121 and the second gate dielectric layer portion 120_2. The second gate electrode portion 150_2 has a triangular profile as can be seen from the cross-sectional view. The first gate electrode portion 150_1 has a rectangular profile as can be seen from the cross-sectional view. The first gate electrode portion 150_1 is bilaterally protruding from the second gate electrode portion 150_2. A sidewall of the first gate electrode portion 150_1 is closer to the drain region 134 compared with the sidewall 117 of the second gate electrode portion 150_2. A top surface of the first gate electrode portion 150_1 is distanced from a bottom of the first gate electrode portion 150_1 by a distance d3. In some embodiments, a ratio of d3 to d2 is in a range from about 0.3 to about 0.6. The gate electrode 150 may be made of a conductive material such as polysilicon (poly), metal or metal alloy. In one embodiment, the gate electrode 150 includes polysilicon. In various embodiments, the gate electrode 150 has a thickness in a range of about 500 to 10,000 angstroms.

In various embodiments, as a particular feature the gate electrode 150 has the first gate electrode portion 150_1 over the semiconductor substrate 102 and the second gate electrode portion 150_2 in the semiconductor substrate 102. The second gate electrode portion 150_2 replaces a portion of the space originally for the isolation region 121. The region between the isolation region 121 and the second gate dielectric layer portion 120_2 has a lower resistance compared with the isolation region 121. Thus, when the MOS transistor 100 is in the "on" state, a current density around the sidewall 119 can be increased, which reduce the device on-resistance (RON). Additionally, when the MOS transistor 100 is in the "off" state, an impact ionization center is move from a corner between the first gate dielectric layer portion 120_1 and the second gate dielectric layer portion 120_2 to a corner between the sidewall 119 and the bottom surface 118, which improve the device breakdown voltage.

The MOS transistor 100 may selectively include an LDD region formed beneath the spacer 162, adjoining the source region 132. In the embodiment that the MOS transistor 100 is a P-type MOS transistor, the LDD region is a P-type lightly doped drain (PLDD) region.

The spacer 162 is contacting a sidewall 111 of the first gate electrode portion 150_1 of the gate electrode 150; the spacer 164 is provided on the isolation region 121 and contacting the sidewall 113 of the first gate electrode portion 150_1. Silicon nitride or silicon dioxide may be employed to make the spacers 162 and 164.

Figure 2:
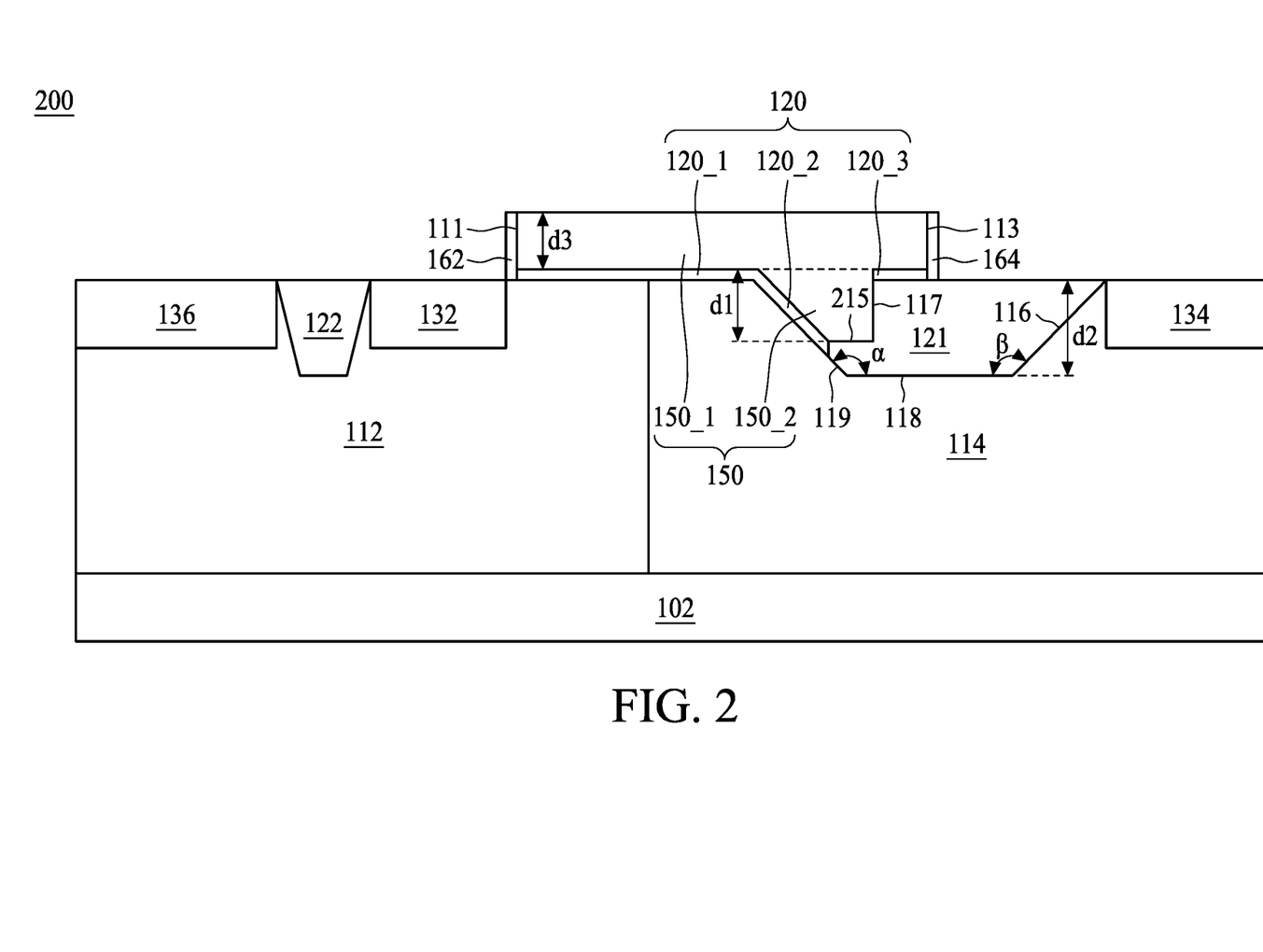
FIG. 2 is a cross-sectional view of a MOS transistor according to a second embodiment of the present disclosure.

It is noteworthy that a size of the second gate electrode portion 150_2 could be arbitrarily adjusted to meet a need for the improvements of a voltage breakdown and device on-resistance (RON), and thus not limited to the embodiments shown in the embodiments of the present disclosure. FIG. 2 is a cross-sectional view of a MOS transistor 200 according to a second embodiment of the present disclosure. To clarify description and avoid repetition, like numerals and letters used to describe the MOS transistor 100 above are used for the MOS transistor 100 in FIG. 2. Also, reference numerals described previously are not described again in detail herein. The difference between the MOS transistor 100 and the MOS transistor 200 is that the MOS transistor 200 includes a larger second gate electrode portion 150_2 compared with the the MOS transistor 100. The sidewall 117 of the second gate electrode portion 150_2 of the MOS transistor 200 is closer to the drain region 134 but still not extends to the sidewall 113 of the first gate electrode portion 150_1. To put it another way, more space originally for the isolation region 121 is replaced by the second gate electrode portion 150_2. As such, more current may be attracted around the sidewall 119 and the device on-resistance (RON) may be further improved. In various embodiments, a bottom surface 215 of the second gate electrode portion 150_2 is substantially parallel to the bottom surface 118 of the isolation region 121. Thus the second gate electrode portion 150_2 of the MOS transistor 200 has a trapezoidal profile as can be seen from the cross-sectional view in FIG. 2.

Figure 3:
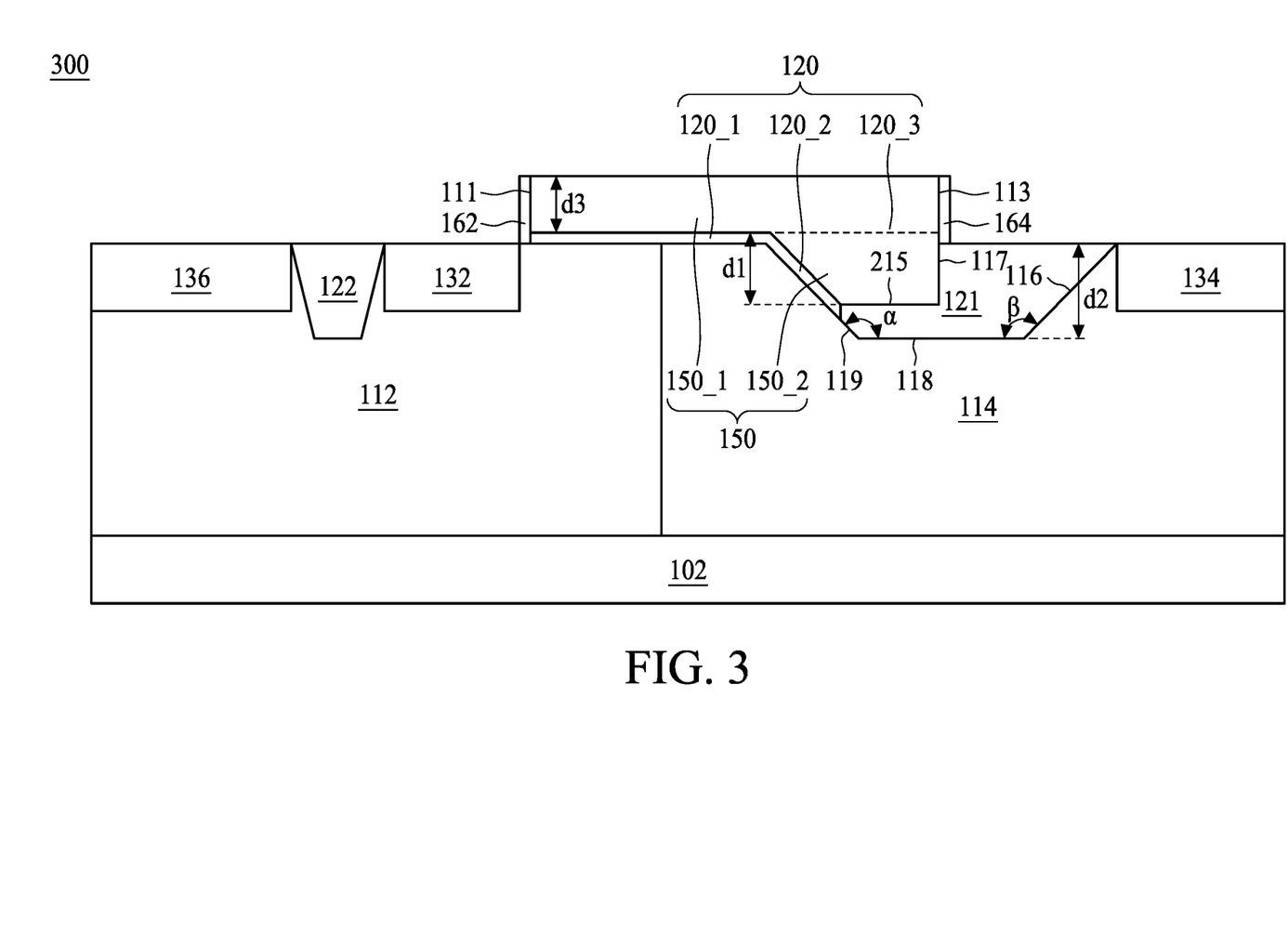
FIG. 3 is a cross-sectional view of a MOS transistor according to a third embodiment of the present disclosure.

FIG. 3 is a cross-sectional view of a MOS transistor 300 according to a third embodiment of the present disclosure. To clarify description and avoid repetition, like numerals and letters used to describe the MOS transistor 100 above are used for the MOS transistor 100 in FIG. 2. Also, reference numerals described previously are not described again in detail herein. The difference between the MOS transistor 300 and the MOS transistor 200 is that the MOS transistor 300 includes a further larger second gate electrode portion 150_2 compared with the MOS transistor 200. The sidewall 117 of the second gate electrode portion 150_2 of the MOS transistor 300 is even closer to the drain region 134 and extends to the sidewall 113 of the first gate electrode portion 150_1. To put it another way, even more space originally for the isolation region 121 is replaced by the second gate electrode portion 150_2. As such, even more current may be attracted around the sidewall 119 and the device on-resistance (RON) may be further improved. The second gate electrode portion 150_2 of the MOS transistor 300 as well has a trapezoidal profile as can be seen from the cross-sectional view in FIG. 3.

FIGS. 4 to 12 are cross-sectional views at various stages of manufacturing the MOS transistor 100. To clarify description and avoid repetition, like numerals and letters used to describe the MOS transistor 100 above are used for the various elements in the coming figures. Also, reference numerals described previously may not be described again in detail herein.

Figure 4:
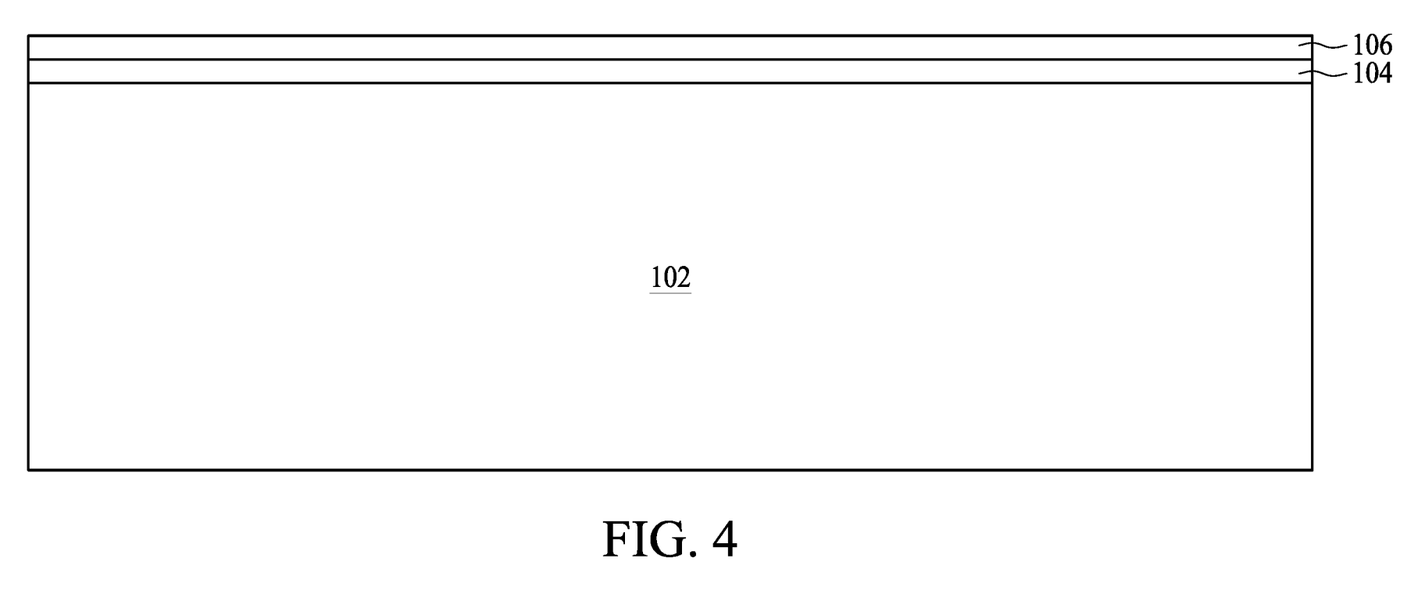
FIGS. 4 to 12 are cross-sectional views at various stages of manufacturing the MOS transistor.

As shown in FIG. 4, a semiconductor substrate 102 is provided. A layer of pad oxide layer 104 is formed over the semiconductor substrate 102. The pad oxide layer 104 may be made of thermally grown material including silicon dioxide, or deposited by chemical vapor deposition (CVD), such as plasma enhanced CVD (PECVD), low pressure CVD (LPCVD) or atmosphere pressure CVD (APCVD). In some embodiments, the pad oxide layer 104 may be grown thermally at a temperature range between about 850 to 950° C., and to a thickness between about 100 to 250 angstroms. A nitride layer 106 is formed over the pad oxide layer 104. In some embodiments, the nitride layer 106 is formed by reacting dichlorosilane ($SiCl_2H_2$) with ammonia ($NH_3$) in an LPCVD chamber at a temperature between about 750 to 850° C. In some embodiments, the thickness of nitride layer 106 is between about 1200 to 2500 angstroms.

Figure 5:
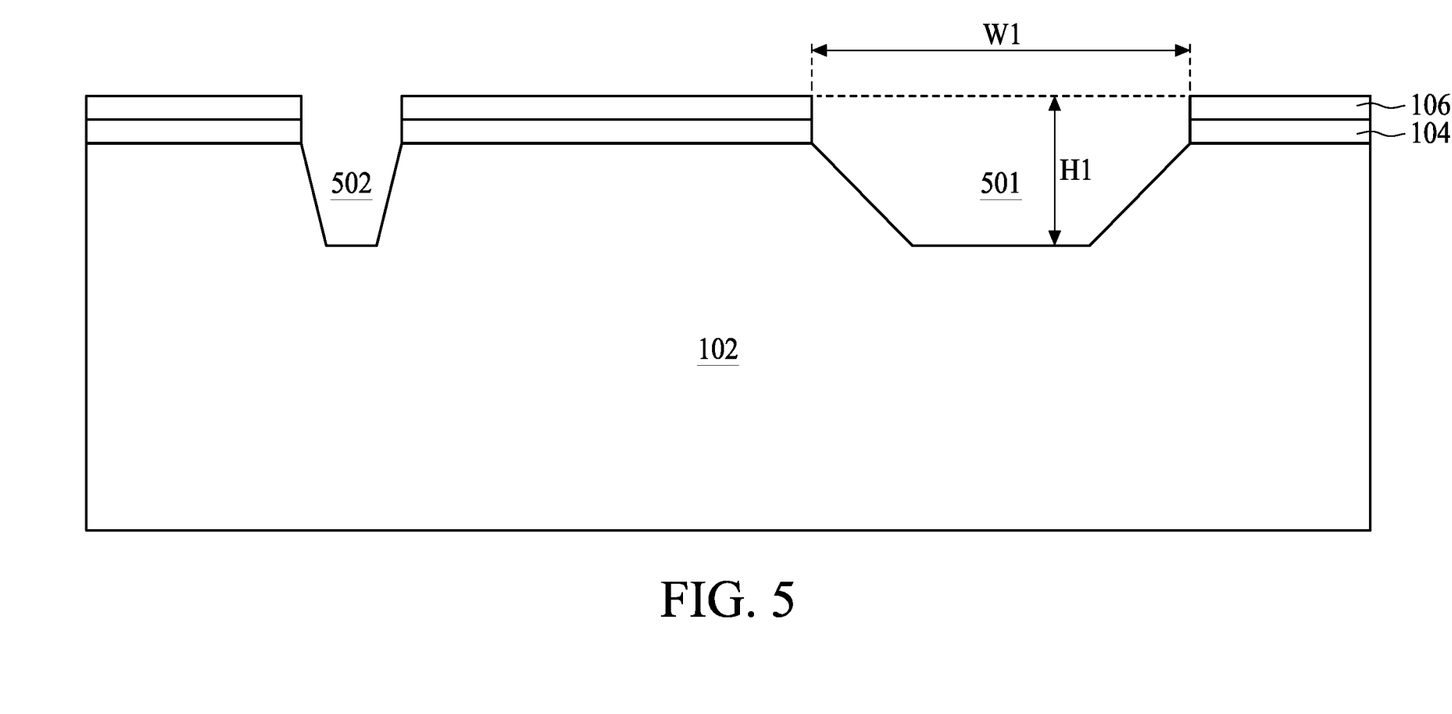

As is illustrated in FIG. 5, isolation trenches 501 and 502 are defined in the nitride layer 106, the pad oxide layer 104 and the semiconductor substrate 102. The isolation trench 501 has a width W1 and a height H1, where the width W1 is preferably greater than about 0.3 microns while the height H1 is preferably from about 3000 to about 5000 angstroms.

Formed upon the semiconductor substrate 102 and defining the widths W1 of the isolation trench 501 and 502 is a patterned silicon oxide pad oxide layer 104 having formed and aligned thereupon a patterned silicon nitride layer 106. Within the preferred embodiment of the method of the present disclosure, the patterned silicon nitride layer 106 serves as a patterned chemical mechanical polish (CMP) polish stop layer, while the patterned silicon oxide pad oxide layer 104 serves as an adhesive forming and stress reducing layers between the semiconductor substrate 102 and the patterned silicon nitride layer 106. While the patterned silicon oxide pad oxide layer 104 and the patterned silicon nitride layer 106 are preferably employed within the preferred embodiment of the method of the present disclosure, they are not required within the method of the present disclosure. However, their presence provides a means for most uniformly forming within the isolation trenches 501 and 502 patterned planarized gap filling silicon oxide trench fill layers through the preferred embodiment of the method of the present disclosure.

The patterned silicon oxide pad oxide layer 104 and the patterned silicon nitride layer 106 may be formed through methods as are conventional in the art of integrated circuit fabrication, which methods will typically, although not exclusively, employ photolithographic patterning of a blanket silicon oxide pad oxide layer which is formed beneath a corresponding blanket silicon nitride layer. The blanket silicon nitride layer and the blanket silicon oxide pad oxide layer may similarly be formed through methods as are conventional in the art of integrated circuit fabrication, including but not limited to thermal oxidation methods, chemical vapor deposition (CVD) methods and physical vapor deposition (PVD) sputtering methods, as are appropriate. Preferably, the patterned silicon oxide pad oxide layer 104 and the corresponding blanket silicon oxide pad oxide layer are formed to a thickness of from about 90 to about 130 angstroms each, where the blanket silicon oxide pad oxide layer is preferably formed through a thermal oxidation method at a temperature of from about 850 to about 950 degrees centigrade. Preferably, the patterned silicon nitride layer 106 and the corresponding blanket silicon nitride layer are formed to a thickness of from about 1500 to about 2000 angstroms each.

Figure 6:
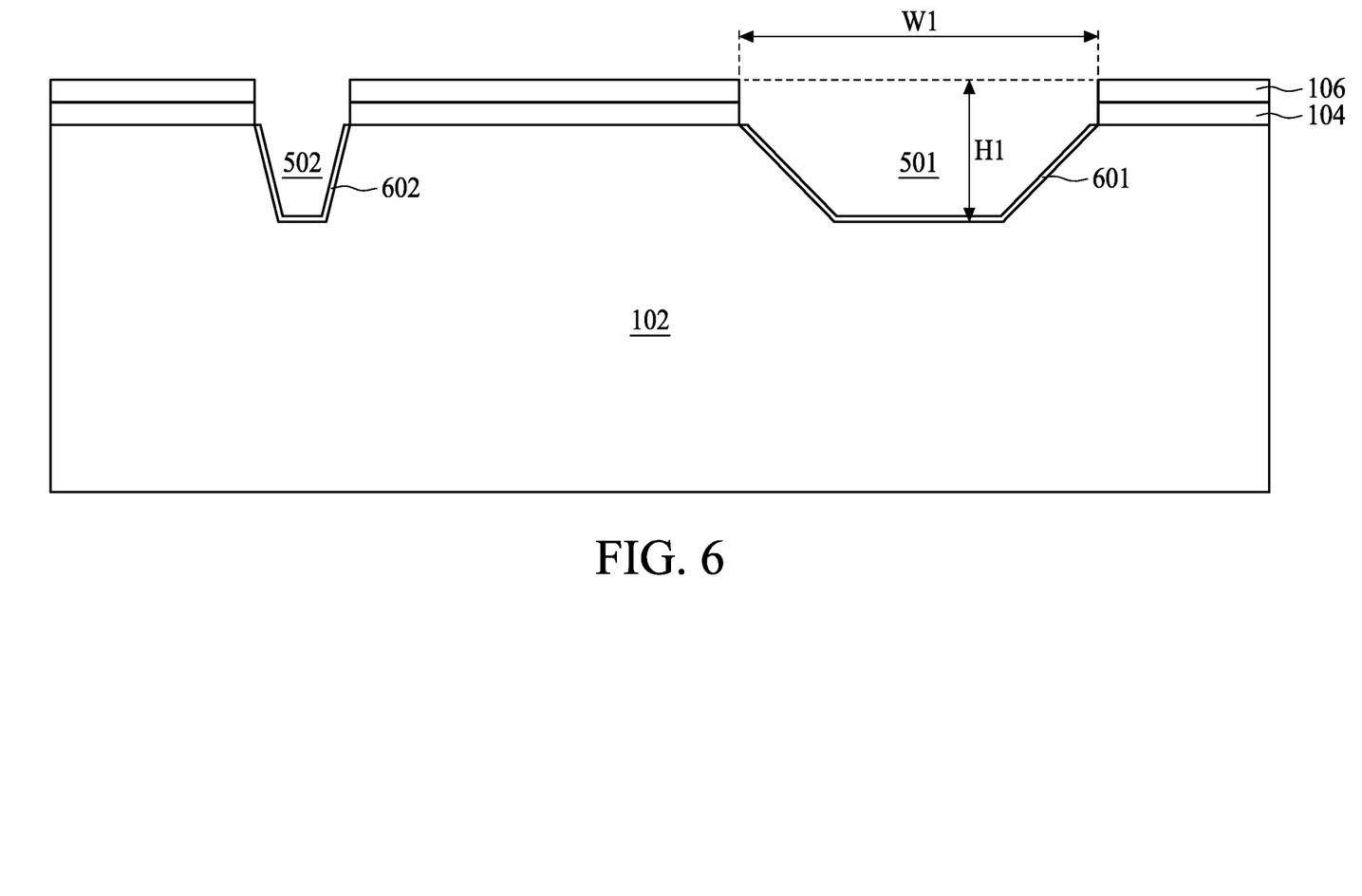

Referring now to FIG. 6, there is shown a schematic cross-sectional diagram illustrating the results of further processing of the semiconductor substrate 102 whose schematic cross-sectional diagram is illustrated in FIG. 5. Shown in FIG. 6 is the presence of a pair of patterned silicon oxide trench liner layers 601 and 602 formed into the corresponding isolation trenches 501 and 502. The patterned silicon oxide trench liner layers 601 and 602 may be formed in a self aligned fashion within each isolation trench 501 or 502 through a plasma enhanced chemical vapor deposition (PECVD) method employing a silane silicon source material. Preferably, the patterned silicon oxide trench liner layers 601 and 602 so formed have a thickness of from about 300 to about 500 angstroms each. The patterned silicon oxide trench liner layers 601 and 602 provide a superior leakage barrier between the semiconductor substrate 102 and trench fill dielectric layers subsequently formed within the isolation trenches 501 and 502.

Figure 7:
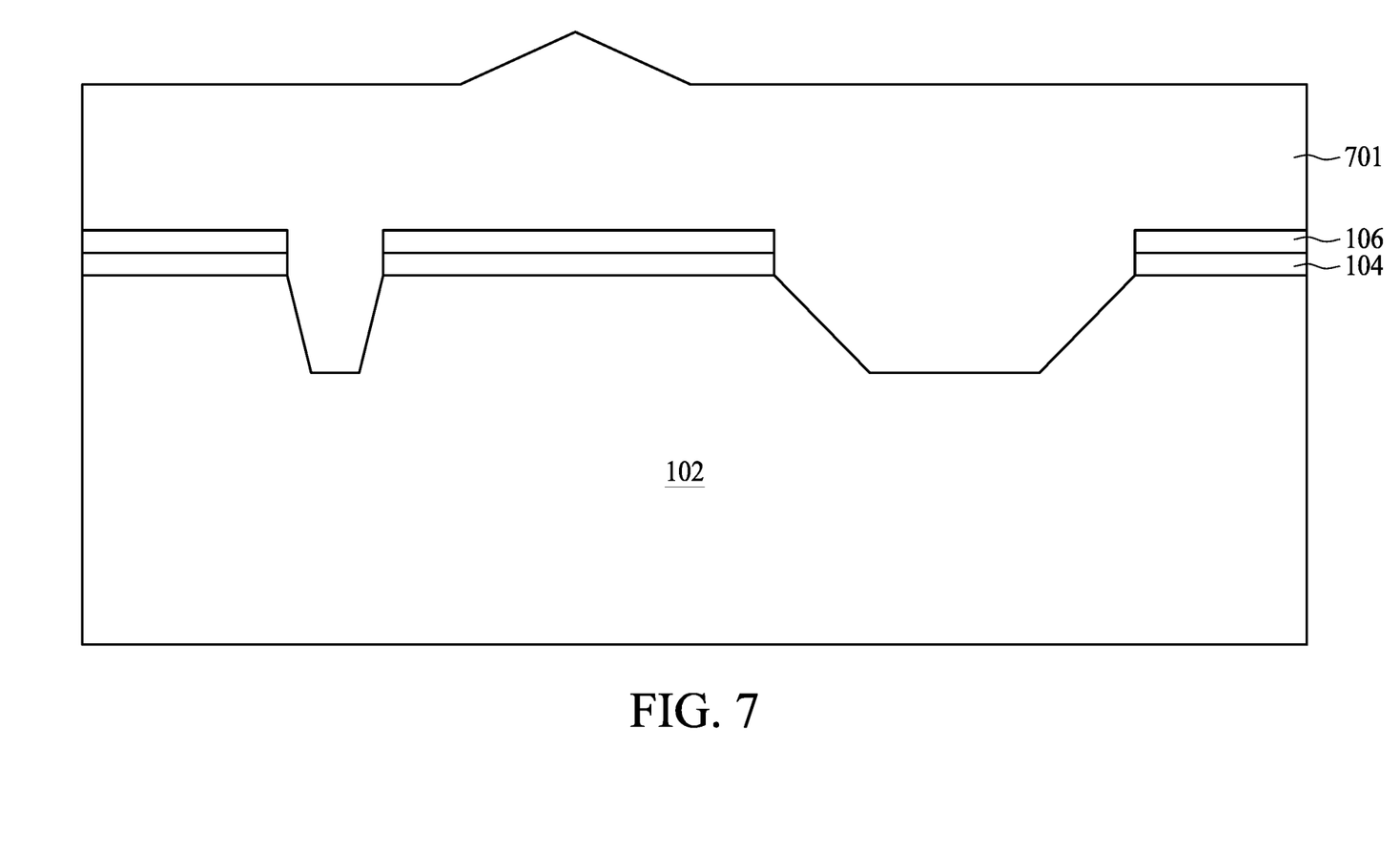

Referring now to FIG. 7, there is shown a schematic cross-sectional diagram illustrating the results of further processing of the semiconductor substrate 102 whose schematic cross-sectional diagram is illustrated in FIG. 6. A silicon oxide trench fill layer 701 is formed in FIG. 7. Within the method of the present disclosure, the silicon oxide trench fill layer 701 may be formed through an ozone assisted sub-atmospheric pressure thermal chemical vapor deposition (SACVD) method. Due to the elevated pressures at which ozone assisted sub-atmospheric pressure thermal chemical vapor deposition (SACVD) methods are employed, these methods preclude plasma activation, but nonetheless provide superior gap filling and planarizing properties to the silicon oxide trench fill layer 701 formed through these methods. Preferably, the ozone assisted sub-atmospheric pressure thermal chemical vapor deposition (SACVD) method employed in forming the silicon oxide trench fill layer 701 employs an ozone oxidant and a tetra-ethyl-ortho-silicate (TEOS) silicon source material at an ozone:TEOS volume ratio of from about 10:1 to about 15:1. Preferably, the silicon oxide trench fill layer 701 is formed to a thickness of from about 6000 to about 8000 angstroms over the semiconductor substrate 102.

Figure 8:
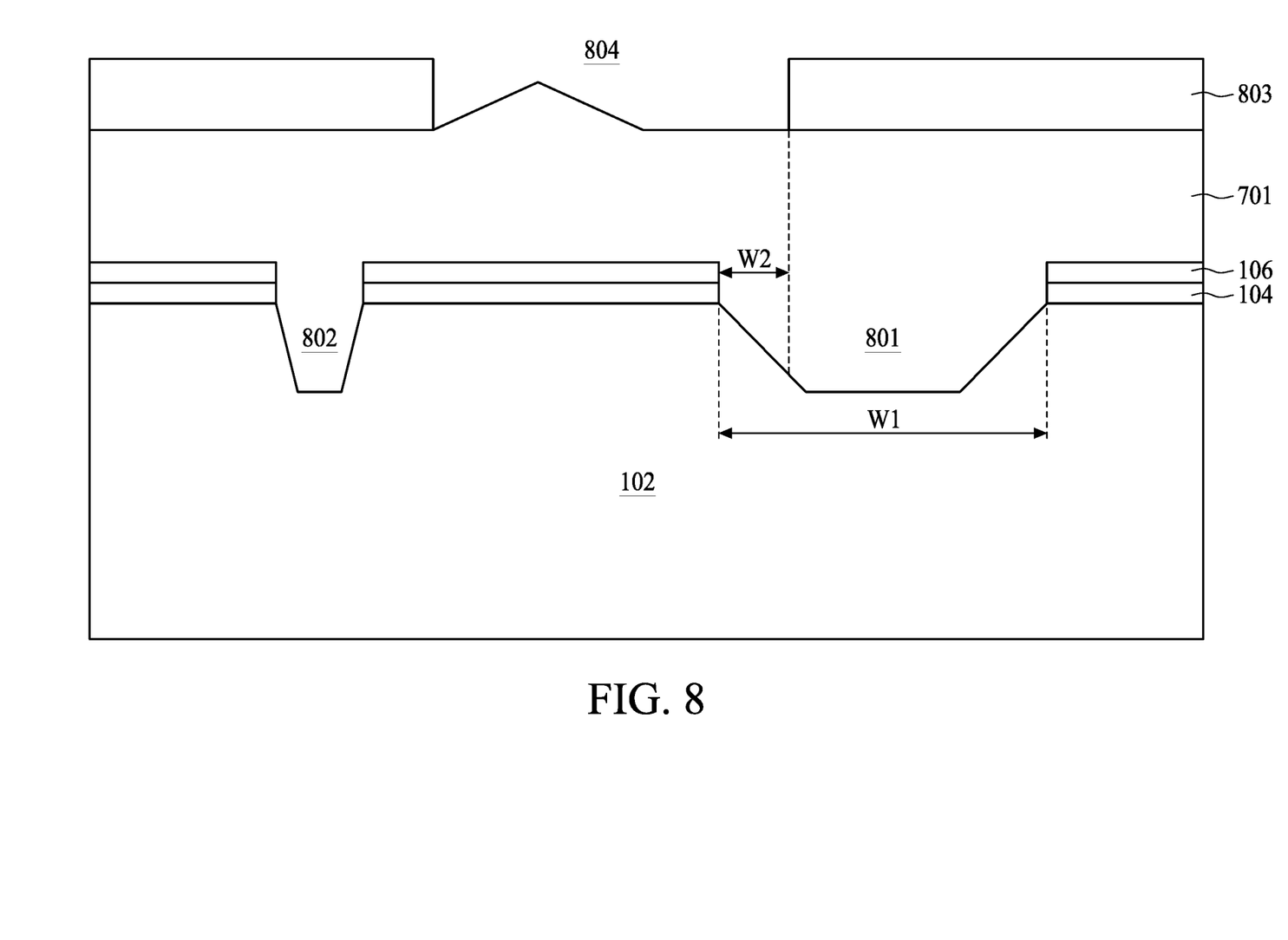

Next, as shown in FIG. 8, a resist layer 803 is formed on the silicon oxide trench fill layer 701 to cover at least an isolation trench area 802 and a portion of an isolation trench area 801. The resist layer 803 may be formed using any of the conventional methods. In other words, an opening 804 of the resist layer 803 is defined to expose a portion the isolation trench area 801 from top. One end of the opening 804 extends across a left end the isolation trench area 802 for a distance W2. The width of W2 is less than the width W1 of the isolation trench 501.

Figure 9:
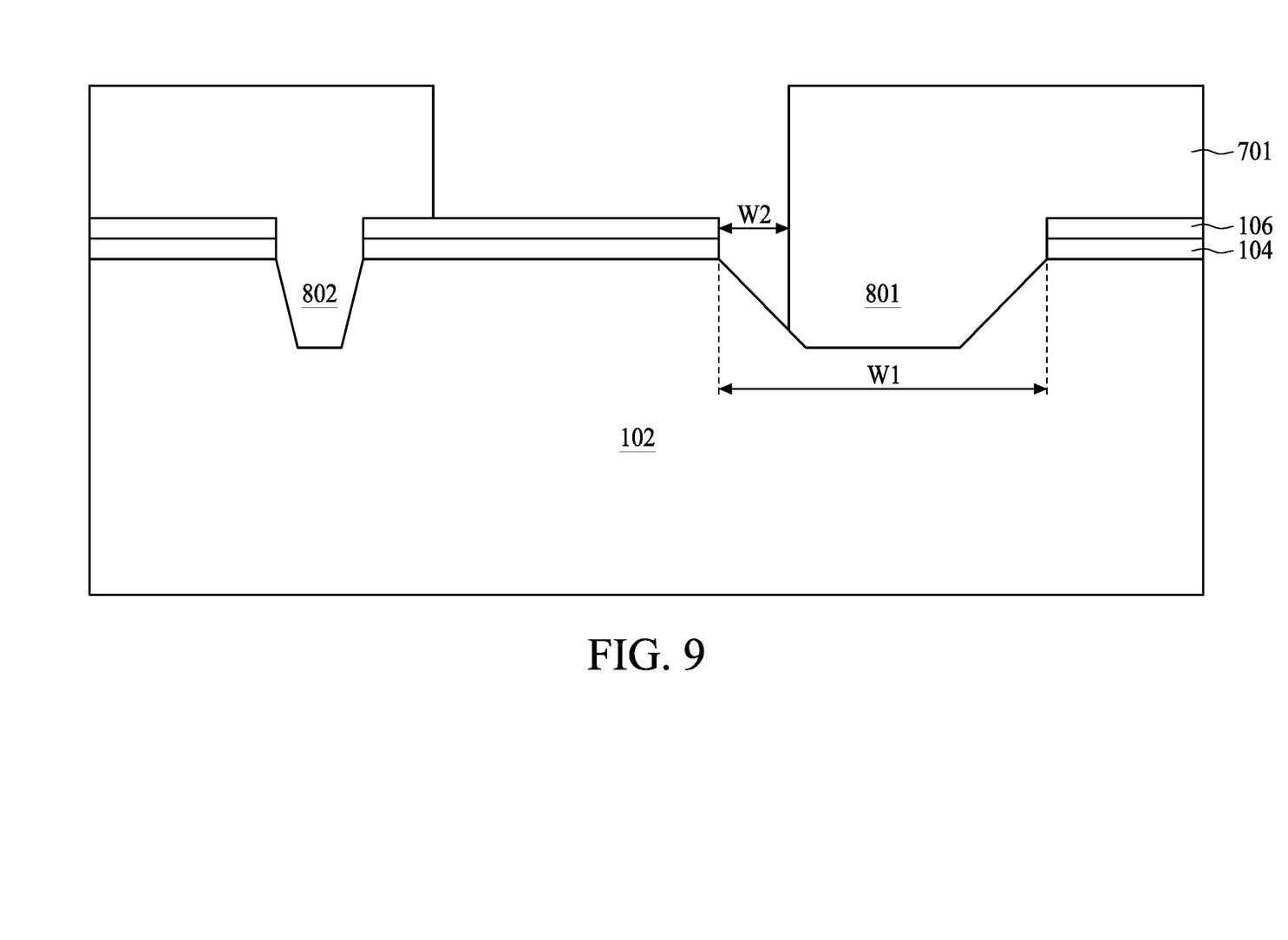

As shown in FIG. 9, using the resist layer 803 as an etch mask, the silicon oxide trench fill layer 701 at least over the opening 804 is etched away for improving the subsequent CMP process. This reduces the trench dishing effect in the isolation trench areas 801 and 802. In addition, a portion of the silicon oxide trench fill layer 701 in the isolation trench areas 801 is also etched away for allowing a gate electrode to extend into the portion as will be described in detail for improving electrical characteristics. After the etching process, the resist layer 803 is removed.

Figure 10:
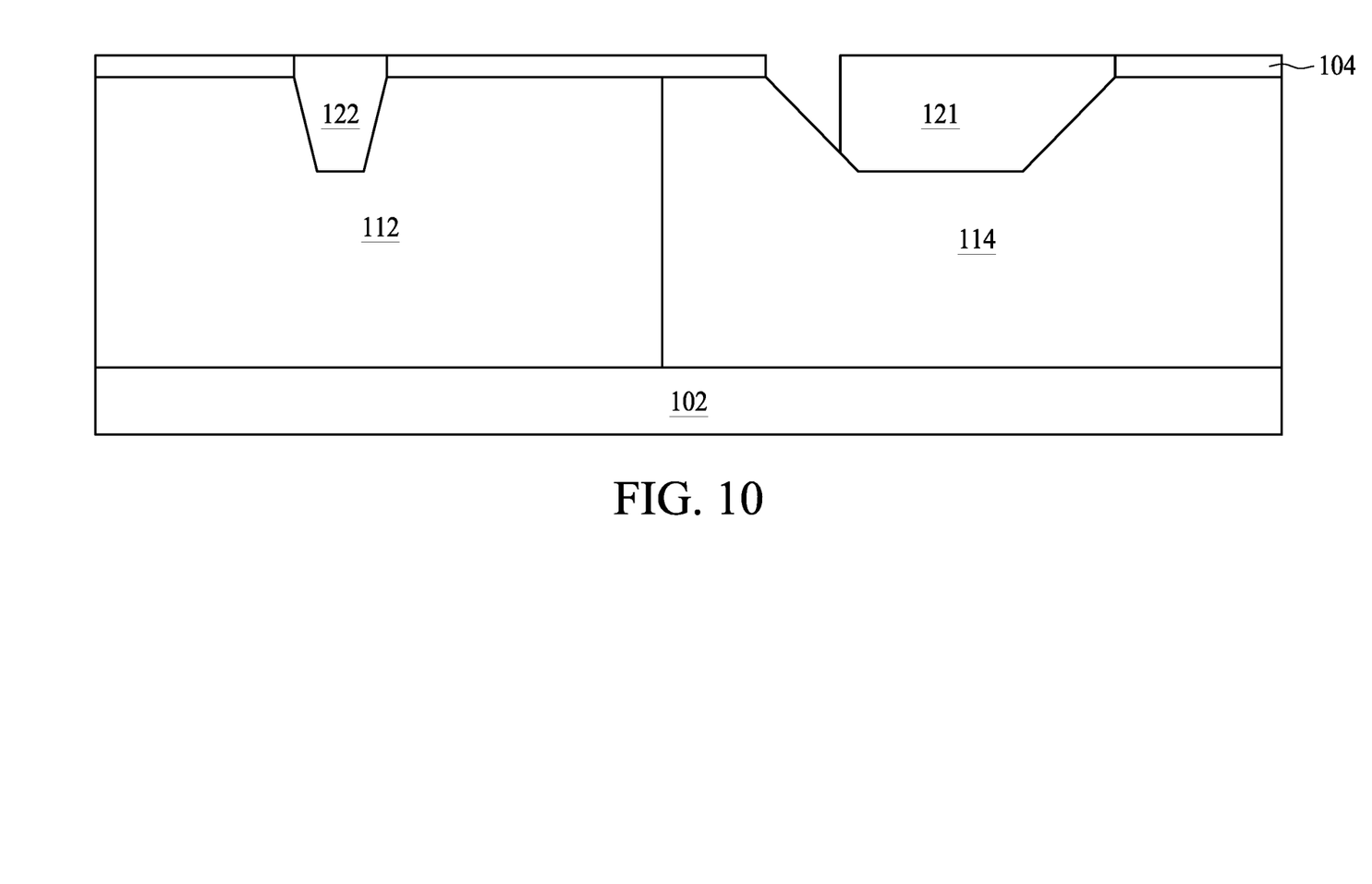

Turning to FIG. 10, a portion of the remaining silicon oxide trench fill layer 701 is removed through a CMP planarizing process thereby leaving the planarized dielectric layers 121 and 122 in the STI regions. The nitride layer 106 over the pad oxide layer 104 is also removed after the removal of the silicon oxide trench fill layer 701.

A photoresist layer (not shown) may be deposited over the top surface of the patterned silicon oxide pad oxide layer 104. The photoresist layer is subjected to a lithography process for the second well region 112 of the second conductivity type. In the embodiment that the MOS transistor to be formed is a P-type MOS transistor, the second well region 112 is doped with N-type dopants; in other words, the second well region 112 is considered as an N-type well (NW) region or a high voltage N-well (HVNW) region. The photoresist layer is developed to expose the pad oxide layer 104 over the region of the HVNW 112. The portions of the semiconductor substrate 102 underneath the exposed pad oxide layer 104 are implanted with a dopant to form the HVNW regions 112. The dopant for the HVNW region 112 may include phosphorus, for example. The HVNW 112 may include a depth of between about 3.5 to 4 μm, and may be formed using an implantation of on the order of $10^{12}$ to $10^{13}$ dopant concentration at 120 keV, as examples.

Then the photoresist layer is removed, and another photoresist layer (not shown) is deposited over the pad oxide layer 104. The photoresist layer is patterned with desired pattern for the first well region 114 of the first conductivity type. In the embodiment that the MOS transistor to be formed is a P-type MOS transistor, the first well region 114 is doped with P-type dopants; in other words, the first well region 114 is considered as a P-type well (PW) region or a high voltage P-well (HVPW) region. The photoresist layer is developed to expose the pad oxide layer 104 over the region of the HVPW 114. The portions of the semiconductor substrate 102 underneath the exposed pad oxide layer 104 are implanted with a dopant to form the HVPW regions 114. The dopant for the HVPW region 114 may include boron, for example. The HVPW 114 may include a depth of between about 3.5 to 4 μm, and may be formed using an implantation of on the order of $10^{12}$ to $10^{13}$ dopant concentration at 90 keV, as examples.

Figure 11:
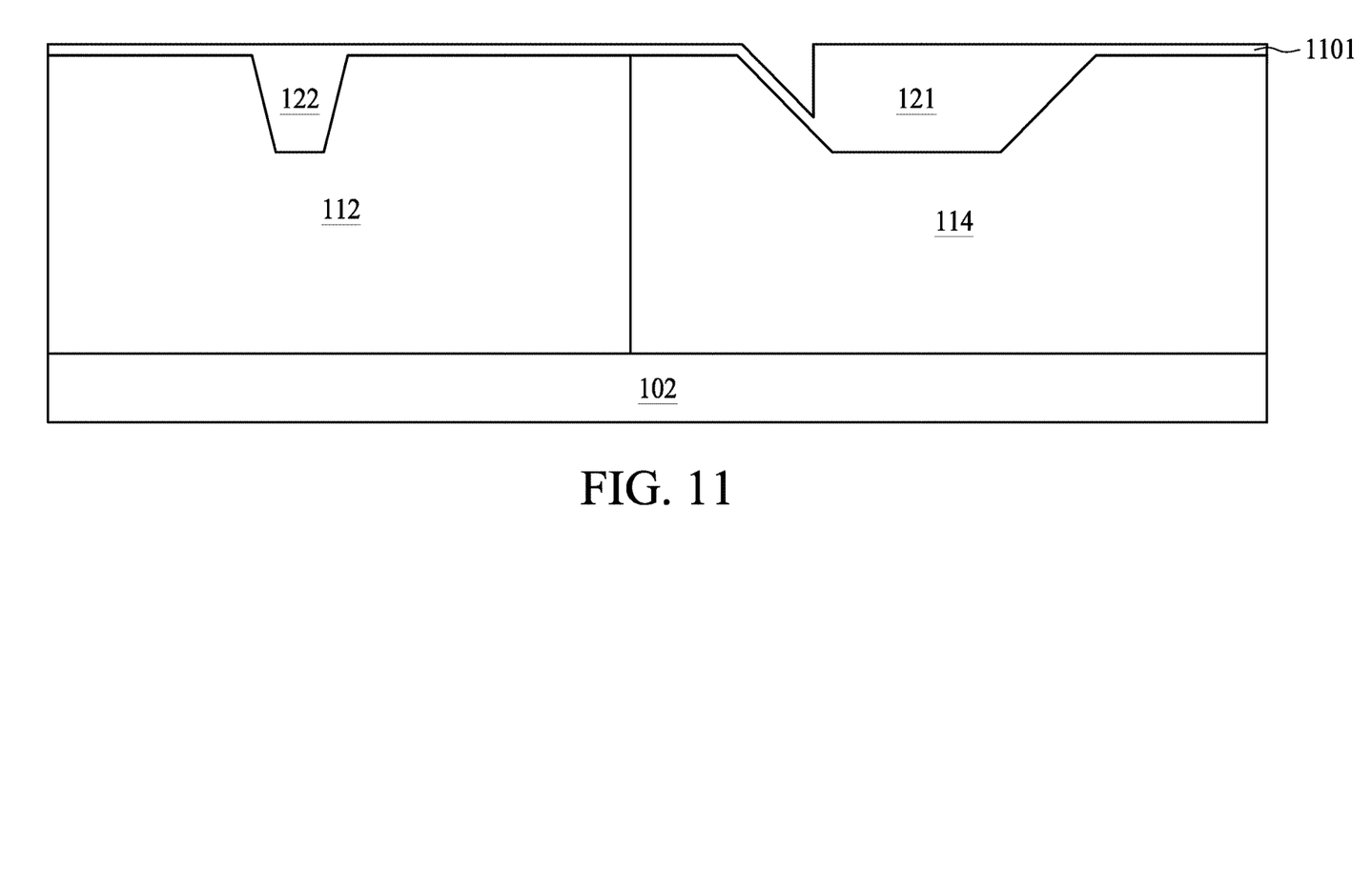
Figure 12:
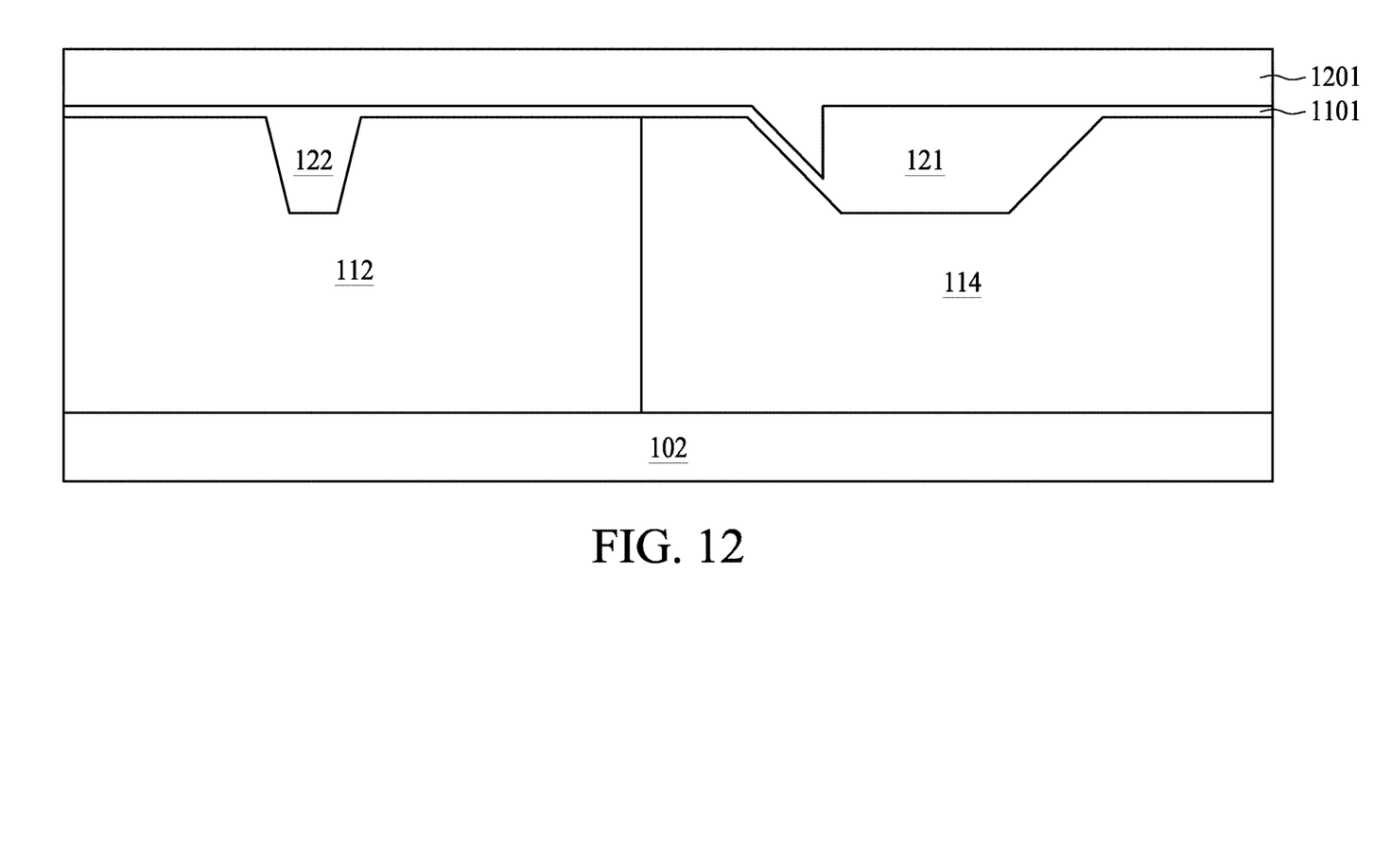

Next, as illustrated in FIG. 11, the pad oxide layer 104 is removed. A gate dielectric layer 1101 may be formed over the semiconductor substrate 102 by thermal grown method or deposition. As an example, the gate dielectric layer 1101 may be made of thermally grown material including silicon dioxide or silicon nitride, or deposited by chemical vapor deposition (CVD), such as plasma enhanced CVD (PECVD), low pressure CVD (LPCVD) or atmosphere pressure CVD (APCVD). Next, as shown in FIG. 12, a gate layer 1201 such as a polysilicon layer is deposited on the gate dielectric layer 1101.

Finally, the gate layer 1201 is then patterned to form the gate electrode 150. Sequentially, the gate electrode 150 is acted as a mask, and the gate dielectric layer 1101 is dry etched to form the gate dielectric layer 120 beneath the gate electrode 150. The first and second spacers 162, 164, the source region 132, the drain region 134 and the pickup region 136 are formed by any conventional method. For an example, deposition, photolithographic and etching processes are sequentially performed to form the first and second spacers 162, 164 at the opposite sidewalls of the gate electrode 150. The dopants of the first conductivity type are then respectively implanted into a selective area of the second well region region 112 and a selective area of the first well region region 114 to form the source region 132 and the drain region 134 as shown in FIG. 1.

Some embodiments of the present disclosure provide a semiconductor structure. The semiconductor structure includes: a substrate; an isolation region adjacent to the drain region; a gate electrode over the substrate and further downwardly extends into the substrate, wherein a portion of the gate electrode below a top surface of the substrate abuts the isolation region; and a source region and a drain region formed in the substrate on either side of the gate structure.

Some embodiments of the present disclosure provide a semiconductor structure. The semiconductor structure includes: a substrate; a gate electrode having a first portion and a second portion, the first portion being over a top surface of the substrate and the second portion being below the top surface of the substrate, the first portion being laterally protruding from a sidewall of the second portion, and the second portion is isolated from the substrate by a dielectric region in the substrate; and a source region and a drain region formed in the substrate on either side of the gate structure.

Some embodiments of the present disclosure provide a method for fabricating a semiconductor structure. The method includes: providing a substrate; forming an isolation trench in the substrate; forming a silicon oxide trench fill layer to at least fill the isolation trench; removing a portion of the silicon oxide trench fill layer in the isolation trench; forming a gate dielectric layer over the substrate; and forming a gate layer over the substrate to fill the isolation trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor structure, comprising:
    providing a substrate;
    forming an isolation trench in the substrate;
    forming a silicon oxide trench fill layer to at least fill the isolation trench in the substrate;
    removing a portion of the silicon oxide trench fill layer in the isolation trench in the substrate to expose a sidewall of the isolation trench in the substrate without exposing a bottom of the isolation trench in the substrate;
    forming a gate dielectric layer over the substrate; and
    forming a gate electrode layer over the substrate to fill an empty portion of the isolation trench in the substrate.

2. The method of claim 1, further comprising:
    forming a pad oxide layer over the substrate.

3. The method of claim 2, further comprising:
    forming a nitride layer over the pad oxide layer.

4. The method of claim 3, wherein the formation of the isolation trench in the substrate comprises:
    defining an isolation trench in the nitride layer, the pad oxide layer and the substrate.

5. The method of claim 4, further comprising:
    forming a silicon oxide trench liner layer into the isolation trench in the substrate.

6. The method of claim 1, wherein the formation of the silicon oxide trench fill layer comprises:
    forming the silicon oxide trench fill layer through an ozone assisted sub-atmospheric pressure thermal chemical vapor deposition (SACVD) method.

7. The method of claim 1, wherein the removing the portion of the silicon oxide trench fill layer in the isolation trench in the substrate comprises:
    forming a resist layer on the silicon oxide trench fill layer to cover a portion of the isolation trench in the substrate; and
    etching away at least the portion of the silicon oxide trench fill layer in the isolation trench in the substrate.

8. The method of claim 1, further comprising:
    performing a planarizing process to the remaining silicon oxide trench fill layer.

9. A method for fabricating a semiconductor structure, comprising:
    providing a substrate having a top surface;
    forming an isolation trench in the substrate;
    forming a silicon oxide trench fill layer to fill the isolation trench in the substrate;
    removing a portion of the silicon oxide trench fill layer in the isolation trench in the substrate to expose a sidewall of the isolation trench in the substrate without exposing a bottom of the isolation trench in the substrate;
    performing a planarizing process to the remaining silicon oxide trench fill layer; and
    forming a gate electrode over the top surface of the substrate to fill an empty portion of the isolation trench in the substrate.

10. The method of claim 9, wherein a portion of the gate electrode below the top surface of the substrate has a trapezoidal profile in a cross-sectional view.

11. The method of claim 10, further comprising:
    forming a gate dielectric layer over the substrate.

12. The method of claim 11, wherein the gate dielectric layer extends to a bottom of the portion of the gate electrode below the top surface of the substrate without extending along the bottom.

13. The method of claim 9, further comprising:
    forming a pad oxide layer over the substrate.

14. The method of claim 13, further comprising:
    forming a nitride layer over the pad oxide layer.

15. The method of claim 14, wherein the formation of the isolation trench in the substrate comprises:
    defining an isolation trench in the nitride layer, the pad oxide layer and the substrate.

16. The method of claim 15, further comprising:
    forming a silicon oxide trench liner layer into the isolation trench in the substrate.

17. The method of claim 12, wherein the formation of the silicon oxide trench fill layer comprises:
    forming the silicon oxide trench fill layer through an ozone assisted sub-atmospheric pressure thermal chemical vapor deposition (SACVD) method.

18. A method for fabricating a semiconductor structure, comprising:
    providing a substrate;
    forming an adhesive forming and stress reducing layer over the substrate;
    forming a polish stop layer over the adhesive forming and stress reducing layer;
    forming a first isolation trench and a second isolation trench in the substrate;
    forming a silicon oxide trench fill layer to at least fill the first isolation trench and the second isolation trench in the substrate;
    removing a portion of the silicon oxide trench fill layer in the first isolation trench in the substrate to expose a sidewall of the isolation trench in the substrate without exposing a bottom of the isolation trench in the substrate;
    forming a gate dielectric layer over the substrate; and
    forming a gate electrode layer over the substrate to fill an empty portion of the first isolation trench in the substrate.

19. The method of claim 18, wherein the formation of the first isolation trench and the second isolation trench in the substrate comprises:
    defining a first isolation trench and a second isolation trench in the polish stop layer, the adhesive forming and stress reducing layer and the substrate.

20. The method of claim 19, further comprising:
    forming a silicon oxide trench liner layer into the first isolation trench and the second isolation trench in the substrate.

* * * * *